(12) United States Patent
Lee et al.

(10) Patent No.: US 7,317,172 B2
(45) Date of Patent: Jan. 8, 2008

(54) BAKE SYSTEM

(75) Inventors: Dong-woo Lee, Seoul (KR); Tae-gyu Kim, Hwaseong-si (KR); Jin-sung Lee, Seoul (KR)

(73) Assignee: Samsung Electronics Co., Ltd., Suwon (KR)

( * ) Notice: Subject to any disclaimer, the term of this patent is extended or adjusted under 35 U.S.C. 154(b) by 87 days.

(21) Appl. No.: 11/156,530

(22) Filed: Jun. 21, 2005

(65) Prior Publication Data

US 2006/0011605 A1    Jan. 19, 2006

(30) Foreign Application Priority Data

Jun. 21, 2004    (KR) ...................... 10-2004-0046048

(51) Int. Cl.
*F27B 5/08* (2006.01)
*F27B 5/10* (2006.01)
*F27B 9/06* (2006.01)

(52) U.S. Cl. ...................... 219/390; 392/416; 392/418; 118/725; 118/729

(58) Field of Classification Search ...................... None
See application file for complete search history.

(56) References Cited

U.S. PATENT DOCUMENTS

| | | | |
|---|---|---|---|
| 5,837,555 A * | 11/1998 | Kaltenbrunner et al. | 219/390 |
| 5,872,889 A * | 2/1999 | Kaltenbrunner et al. | 392/418 |
| 6,633,022 B2 * | 10/2003 | Kitano et al. | 219/390 |
| 6,884,066 B2 * | 4/2005 | Nguyen et al. | 118/728 |
| 6,969,829 B2 * | 11/2005 | Tsuruno et al. | 219/390 |
| 7,009,148 B2 * | 3/2006 | Kawano et al. | 118/724 |
| 2001/0011653 A1 * | 8/2001 | Shirakawa et al. | 219/390 |
| 2002/0047004 A1 * | 4/2002 | Johnsgard et al. | 219/390 |

FOREIGN PATENT DOCUMENTS

KR    1999-0037189 U    10/1999

* cited by examiner

*Primary Examiner*—J. Pelham
(74) *Attorney, Agent, or Firm*—Sughrue Mion, PLLC

(57) ABSTRACT

Provided is a bake system. The bake system includes a heating plate having a heating plate having a substrate on an upper surface. A case is disposed below the heating plate to support the heating plate; a first cover is disposed above the heating plate and coupled to the case to form a chamber; and a second cover is disposed in the first cover, and directly above the substrate in the bake process for preventing heat convection on the substrate.

11 Claims, 5 Drawing Sheets

BAKE SYSTEM

BACKGROUND OF THE INVENTION

This application claims the priority of Korean Patent Application No. 10-2004-0046048, filed on Jun. 21, 2004, in the Korean Intellectual Property Office, the disclosure of which is incorporated herein in its entirety by reference.

1. Field of the Invention

The present invention relates to a bake system and, more particularly, to a bake system for manufacturing a semiconductor which can distribute the temperature in a substrate evenly in a bake process.

2. Description of the Related Art

In a photolithography process for fabricating a semiconductor, a bake process such as a pre-bake, in which a photoresist is applied on a surface of a wafer and baked, and a post-exposure bake process, in which the photoresist is exposed in a predetermined pattern and baked, is performed.

A bake system that performs the bake process includes a heating plate, on which the wafer is mounted, and a heater installed on the heating plate to heat the wafer. Here, the heating plate and the heater are disposed in a chamber, in which the bake process is performed. Since a gas, such as the air, flows from a side portion of the chamber, passes above the wafer, and is discharged to the outside through an upper portion of the chamber in the bake process, an air flow, which flows from the outer portion of the wafer to a center portion of the wafer, occurs in the chamber. Generally, in the bake process, the temperature should be distributed evenly in the wafer according to a strict temperature deviation standard. For example, the temperature deviation in the wafer should be less than 0.3° C. in the bake process. However, heat convection occurs due to the above air flow, and the temperature at the center portion of the wafer becomes higher than that of the peripheral portion of the wafer. Therefore, even if the heating plate is heated by the heater evenly, the wafer cannot be heated evenly.

FIG. 1 shows a conventional bake system for solving the above problem. Referring to FIG. 1, a cover 62 is disposed on an upper portion of the heating plate 51, on which the wafer W is mounted, and a chamber S, in which the bake process is performed, is formed in the cover 62. In addition, a first heat pipe 73 of a ring shape that surrounds a discharge hole 65 and a second heat pipe 74 of ring shape on an outer portion of the first heat pipe 73 are installed on an upper wall of the cover 62. In addition, an adiabatic member 75 is inserted between the first heat pipe 73 and the second heat pipe 74. An operating liquid is filled in the first and second heat pipes 73 and 74, and the operating liquid transmits the heat through evaporation and condensation to make the temperature of the upper wall of the cover 62 uniform. In the above structure, when a temperature deviation exists on the upper wall of the cover 62 due to the flow of gas that is induced in the chamber S in the bake process, the first and the second heat pipes 73 and 74, which are controlled by a temperature control device 80, make the temperature of the upper wall of the cover 62 uniform.

However, in, the above described bake system, even if the temperature of the upper wall of the cover 62 is uniform, a temperature deviation may still exist in the wafer W due to the flow of gas. In addition, two heat pipes 73 and 74 must be installed on the upper wall of the cover 62, and thus the structure and temperature controlling mechanism of the bake system become complex.

SUMMARY OF THE INVENTION

The present invention provides a bake system with a dual-cover structure to keep the temperature in a substrate constant when a bake process is performed.

According to an aspect of the present invention, there is provided a bake system including: a heating plate having a substrate on an upper surface thereof; a case disposed below the heating plate and supporting the heating plate; a first cover disposed above the heating plate and coupled to the case to form a chamber; and a second cover disposed in the first cover, and directly above the substrate in the bake process for preventing heat convection on the substrate.

The second cover may be installed to be ascended and descended, and may be descended in the bake process to be positioned a predetermined distance above the substrate.

A supporting member that supports the second cover may be installed to be ascended and descended in the first cover. A connecting member may be disposed between the second cover and the supporting member. An elevation hole that guides the elevation of the supporting member may be formed on a side wall of the first cover, and one end portion of the supporting member may protrude out of the first cover through the elevation hole. One end portion of the supporting member may be connected to a driving source for elevating the supporting member, and the first cover may be elevated by the driving source.

A supporting member that supports the second cover may be installed to be ascended and descended on the first cover. A connecting member that penetrates through the upper wall of the first cover may be disposed between the second cover and the supporting member. An elevation member that moves with the supporting member may be disposed between the end portion of the supporting member and the driving source, and an elevation hole that guides the elevation of the elevation member may be formed on the side wall of the first cover.

A sealing member for sealing the chamber may be disposed between the first cover and the case, and a plurality of elevation pins for elevating the substrate may penetrate through the heating plate in the case.

The distance between the second cover and the substrate may be adjusted based on the temperature of the heating plate, the temperature of the second cover, and the temperature of air in the chamber.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE ILLUSTRATIVE, NON-LIMITING EMBODIMENTS OF THE INVENTION

Exemplary embodiments of the invention will now be described below by reference to the attached Figures. The described exemplary embodiments are intended to assist the understanding of the invention, and are not intended to limit the scope of the invention in any way.

Figure 1:
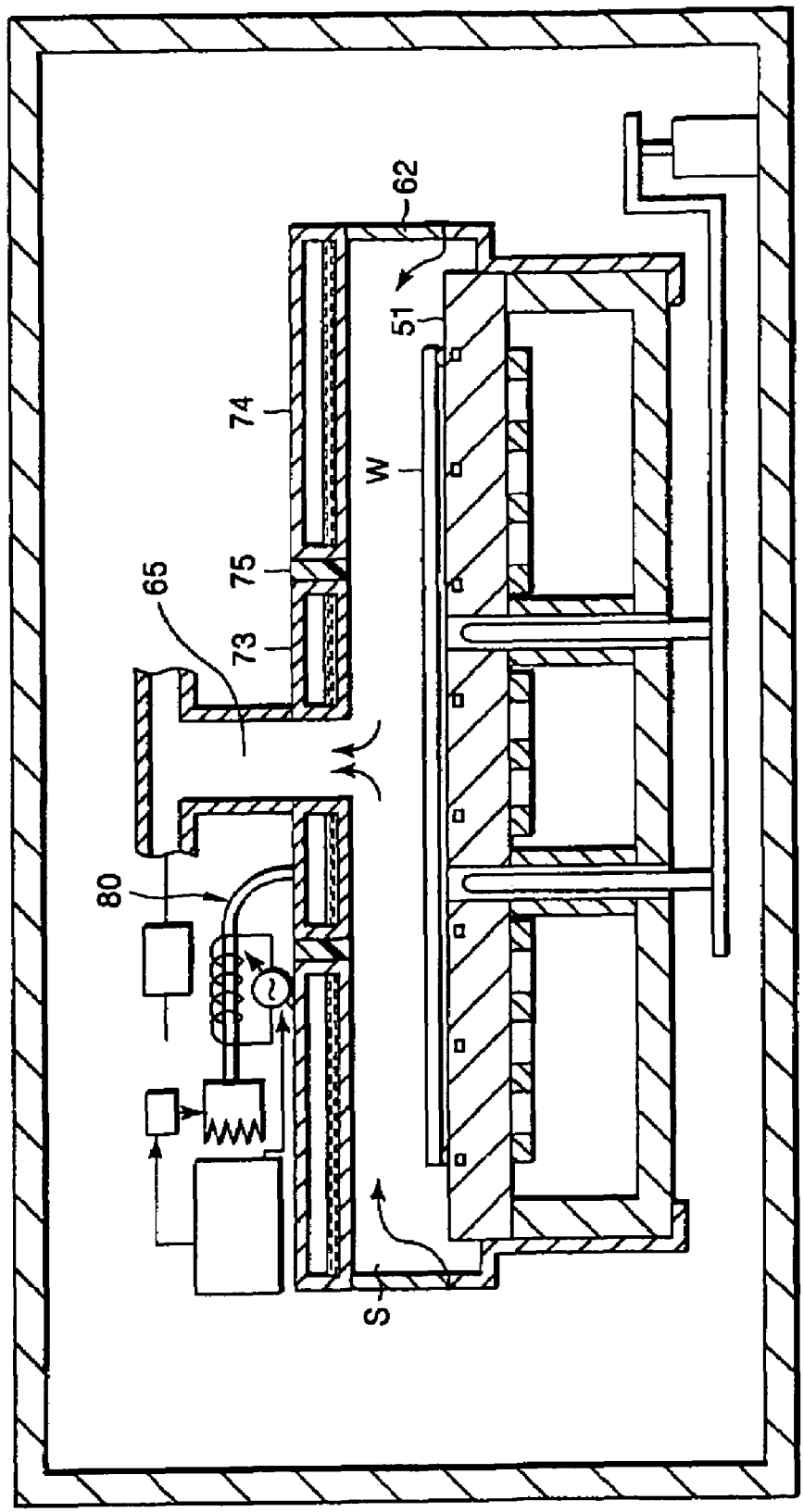
FIG. 1 is a schematic diagram of a conventional bake system.
Figure 2:
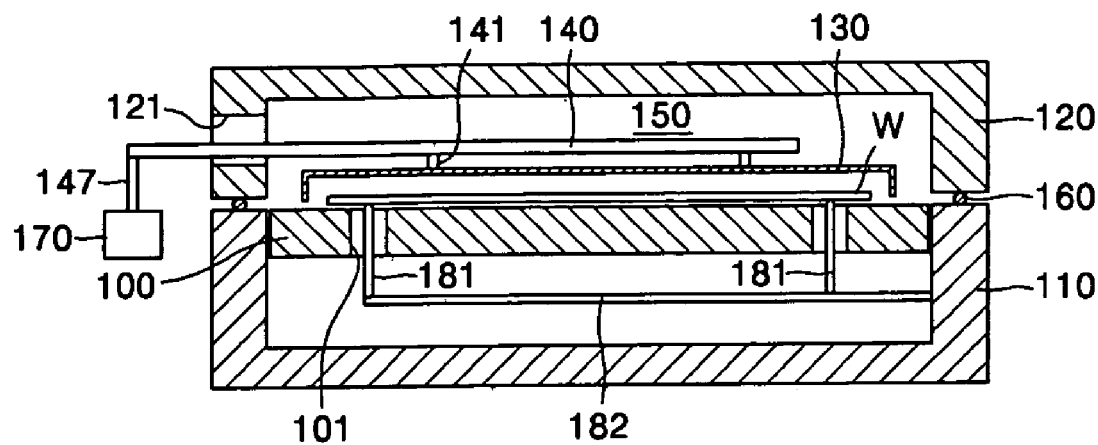
FIG. 2 is a schematic diagram of a bake system according to an exemplary embodiment of the present invention.

FIG. 2 is a cross-sectional view showing a bake system according to an exemplary embodiment of the present invention.

Referring to FIG. 2, the bake system according to an exemplary embodiment of the present invention includes a heating plate 100, a case 110 disposed below the heating plate 100, a first cover 120 disposed above the heating plate 100, and a second cover 130 disposed in the first cover 120.

The heating plate 100 heats a substrate, for example, a wafer W that is mounted thereon to a predetermined temperature. The heating plate 100 includes a heater (not shown) that heats the heating plate 100 by applying an electric current.

The heating plate 100 is supported by the case 110. A plurality of elevating pins 181 that moves the wafer W up-and-down on the heating plate 100 and an elevating pin supporting board 182 that supports the elevating pins 181 are disposed in the case 110. In addition, penetration holes 101, through which the elevating pins 181 penetrate, are formed in the heating plate 100. The end portion of the elevating pin supporting board 182 is connected to a driving unit (not shown) outside of the case 110.

The first cover 120 is installed on the upper portion of the heating plate 100 so as to be ascended and descended. In the bake process the first cover 120 is descended and coupled to the case 110 in order to form a sealed chamber 150, in which the bake operation is performed. A sealing member 160 is disposed between the first cover 120 and the case 110 for sealing the chamber 150 in the bake process.

The second cover 130 is installed so as to be ascended and descended in the first cover 120, and is descended to cover the wafer W in the bake process. Here, the second cover 130 is spaced a predetermined distance from the wafer W so that a heat convection does not occur on the wafer W in the bake process.

The second cover 130 is supported by a supporting member 140, and the supporting member 140 is installed so as to be ascended and descended with the second cover 130. Here, a connecting member 141 is disposed between the supporting member 140 and the second cover 130. In addition, an elevation hole 121 that guides the elevation of the supporting member 140 is formed on a side wall of the first cover 120, and an end portion of the supporting member 140 protrudes out of the elevation hole 121. The end portion of the supporting member 140 is connected to a driving source 170 that elevates the supporting member 140. Here, a rod 147 that elevates the supporting member 140 by receiving driving power from the driving source 170 is disposed between one end of the supporting member 140 and the driving source 170.

In the bake system having the above structure, when the air flows into the chamber 150 in the bake process, the same flow of the air that causes heat convection in the wafer W occurs. However, according to an exemplary embodiment of the present invention, since the second cover 130 covers the wafer W with a predetermined interval therebetween, the air does not flow in the space between the wafer W and the second cover 130. Accordingly, heat convection does not occur in the wafer W and the temperature in the wafer W is distributed evenly. In the bake process, the distance between the second cover 130 and the wafer W is determined by the temperature difference between the heating plate 100 and the second cover 130, and the temperature of the air in the chamber 150. For example, in a case where the difference between temperatures of the heating plate 100 and the second cover 130 is 30° C., the distance between the second cover 130 and the wafer W, which can prevent the heat convection from occurring, is about 10 mm.

Operations of the bake system according to an exemplary embodiment of the present invention will be described in the following.

Figure 3A:
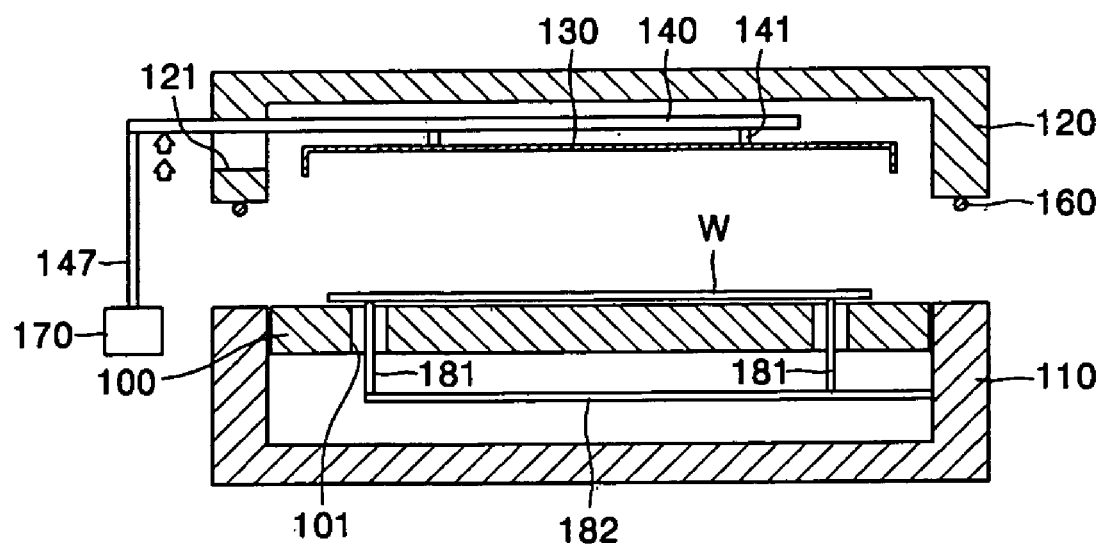
FIG. 3A is a schematic diagram showing a state when a chamber of the bake system according to the first exemplary embodiment of the present invention is opened.
Figure 3B:
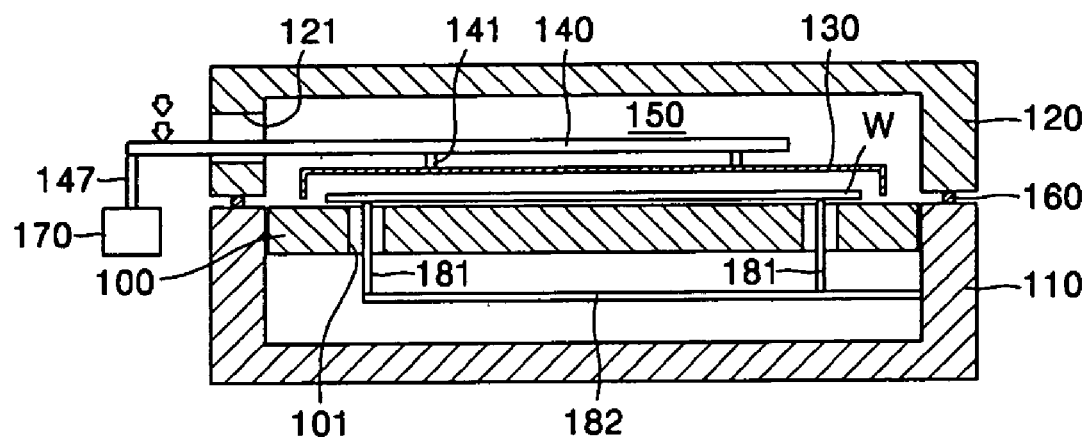
FIG. 3B is a schematic diagram showing a state when the chamber of the bake system according to an exemplary embodiment of the present invention is closed.
Figure 3C:
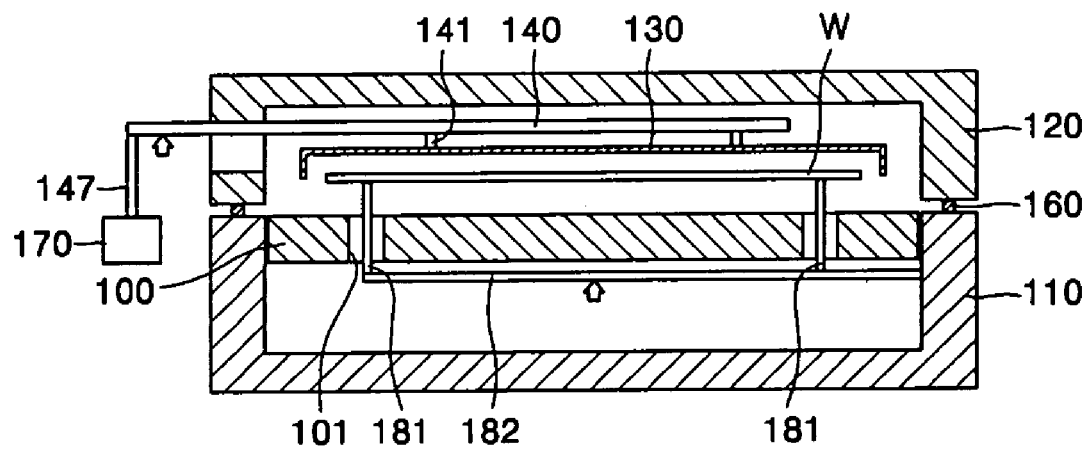
FIG. 3C is a schematic diagram showing a wafer in a standby state after performing the bake process in the bake system according to an exemplary embodiment of the present invention.

FIGS. 3A through 3C are schematic diagrams showing the states of: opening the chamber 150, closing the chamber 150, and the wafer W standby state after performing the bake process in the bake system according to an exemplary embodiment of the present invention.

As shown in FIG. 3A, when the rod 147 rises due to the driving source 170, the supporting member 140 and the second cover 130 also rise. In addition, when the supporting member 140 rises, the end portion of the supporting member 140 in the elevation hole 121 of the first cover 120 pushes the first cover 120 upward to open the chamber (reference numeral 150 in FIG. 2). In the open state of the chamber 150, the wafer W can be mounted on the heating plate 100, or the wafer W mounted on the heating plate 100 can be removed.

In addition, as shown in FIG. 3B, when the rod 147 is lowered by the driving source 170, the first cover 120 also lowers with the supporting member 140. Then, when the first cover 120 is lowered enough, the first cover 120 is coupled to the case 110 and thus seals the chamber 150. The supporting member 140 is lowered continuously until the second cover 130 is positioned a predetermined distance above the wafer W. In the above state, the bake process is performed, and heat convection does not occur on the wafer W due to the presence of the second cover 130 above the wafer W. Thus, the wafer W can be heated uniformly.

As shown in FIG. 3C, after the bake process, when the rod 147 is raised by the driving source 170, the supporting member 140 and the second cover 130 are also raised a predetermined height in the sealed chamber 150. Here, the wafer W is also raised the same height by the elevating pins 181. Thus, the distance between the second cover 130 and the wafer W can be kept constant in order to keep the temperature distribution in the wafer W uniform. In the above state, the wafer W is in the standby state in the sealed chamber 150, ready for the next process.

Figure 4:
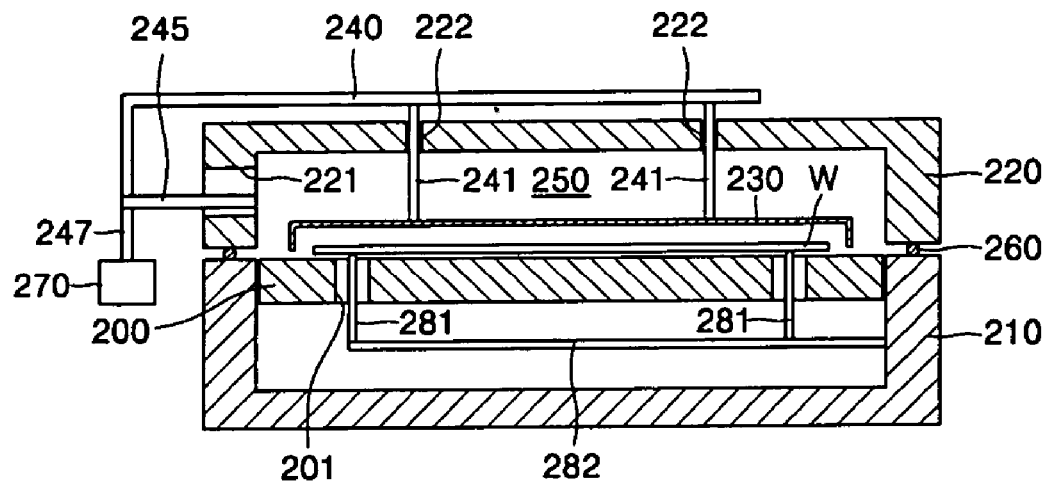
FIG. 4 is a schematic diagram view showing a bake system according to another exemplary embodiment of the present invention.

FIG. 4 is a schematic diagram showing a bake system according to another exemplary embodiment of the present invention.

Referring to FIG. 4, the bake system according to another exemplary embodiment of the present invention includes a heating plate 200, on which the wafer W is mounted, a case 210 disposed below the heating plate 200 in order to support the heating plate 200, a first cover 220 disposed on an upper portion of the heating plate 200, and a second cover 230 disposed in the chamber 250.

A plurality of elevation pins 281 for moving up and down the wafer W on the heating plate 200 and an elevation pin supporting board 282 are disposed in the case 210. First penetration holes 201, through which the elevation pins 281 penetrates, are formed on the heating plate 200. An end portion of the elevation pin supporting board 282 is connected to a driving unit (not shown) on the outside of the case 210.

The first cover 220 is installed so as to be ascended and descended on the heating plate 200. The first cover 220 is descended and coupled to the case 210 to form a sealed chamber 250, in which the bake process is performed. In addition, a sealing member 260 is disposed between the first cover 220 and the case 210.

The second cover 230 is installed so as to be ascended and descended in the first cover 220, and is descended to cover the wafer W in the bake process. Here, the second cover 230 is disposed a predetermined distance from the wafer W so that a heat convection does not occur on the wafer W in the bake process.

The second cover 230 is supported by the supporting member 240. Here, the supporting member 240 is installed outside of the first cover 220 unlike the above exemplary embodiment. In more detail, the supporting member 240 is installed on the first cover 220 and is ascended and descended with the second cover 230. Here, a connecting member 241 is disposed between the supporting member 240 and the second cover 230, and a second penetration hole 222 is formed in an upper wall of the first cover 200 so that the connecting member 241 can penetrate and ascend and descended through.

An end portion of the supporting member 240 is connected to a driving source 270 that elevates the supporting member 240, and a rod 247 that elevates the supporting member 240 by receiving the driving force from the driving source 270 is disposed between the end portion of the supporting member 240 and the driving source 270.

An elevation member 245 that moves with the supporting member 240 may be further disposed on the end portion of the supporting member 240. In this case, an elevation hole 221 that guides the elevation of the elevation member 245 is formed on the side wall of the first cover 220.

Hereinafter, operations of the bake system according to the exemplary embodiment as shown in FIG. 4 will be described.

Figure 5A:
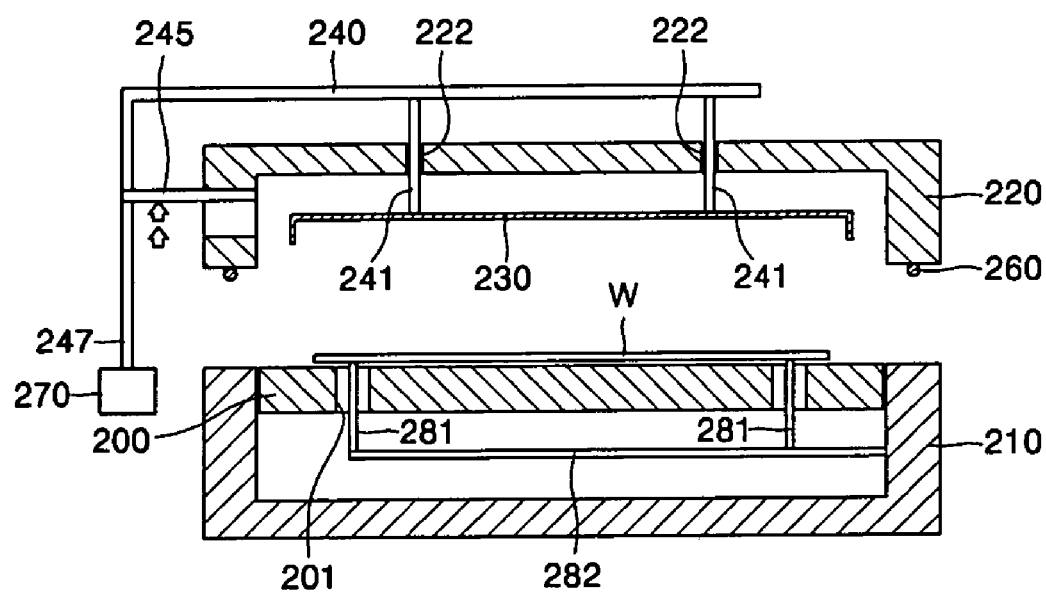
FIG. 5A is a schematic diagram showing a state when a chamber of the bake system according to an exemplary embodiment of the present invention is opened.
Figure 5B:
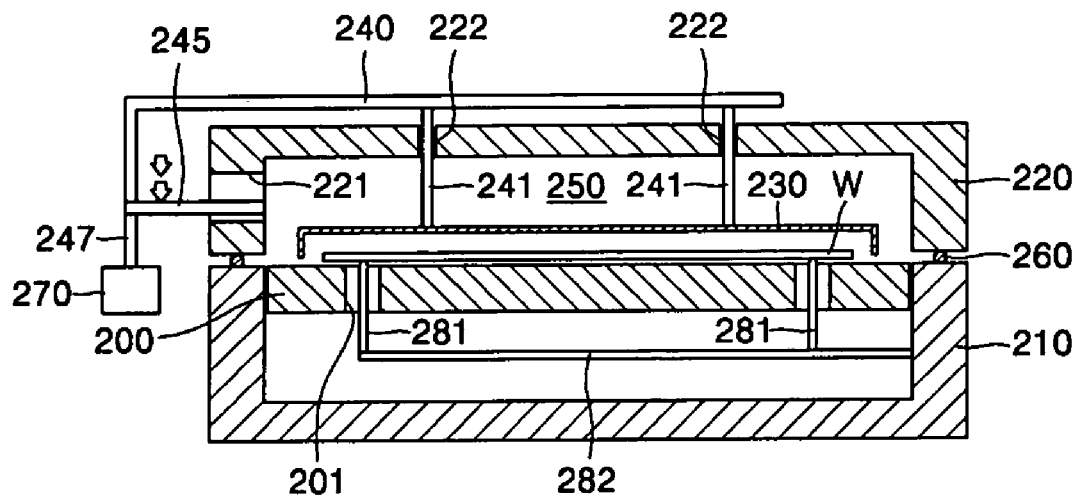
FIG. 5B is a schematic diagram showing a state when the chamber of the bake system according to an exemplary embodiment of the present invention is closed.
Figure 5C:
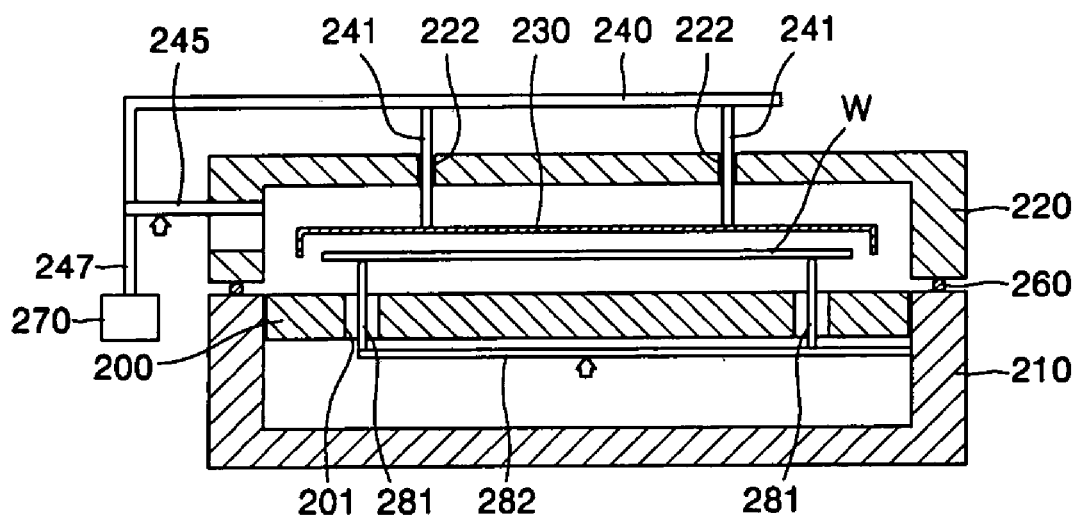
FIG. 5C is a schematic diagram showing a wafer in a standby state after performing the bake process has been performed in the bake system according to an exemplary embodiment of the present invention.

FIGS. 5A through 5C are views showing the states of opening the chamber 250, closing the chamber 250, and the wafer W in the standby state in the bake system according to another exemplary embodiment of the present invention.

As shown in FIG. 5A, when the rod 247 is lifted by the driving source 270, the elevation member 245 and the supporting member 240 are also lifted. Here, the elevation member 245 is ascended along the elevation hole 221, and the connecting member 241 connecting the supporting member 240 and the second cover 230 is lifted along the second penetration hole 222. In addition, when the elevation member 245 and the supporting member 240 are lifted, the elevation member 245 in the elevation hole 221 of the first cover 220 pushes the first cover 220 upward to open the chamber (reference numeral 250 in FIG. 4). In the state where the chamber 250 is opened, the wafer W can be mounted or removed from the heating plate 200.

Next, as shown in FIG. 5B, when the rod 247 is lowered by the driving source 270, the first cover 220 is lowered with the supporting member 240 and the elevation member 245. In addition, when the first cover 220 is lowered enough, the first cover 220 becomes coupled to the case 210 and forms the sealed chamber 250. Then, the supporting member 240 and the elevation member 245 are lowered until the second cover 230 is positioned a predetermined distance above the wafer W. The bake process is performed in that state and heat convection does not occur on the wafer W due to the presence of second cover 230. Thus, the wafer W is heated evenly.

In addition, as shown in FIG. 5C, when the rod 247 is lifted by the driving source 270 after performing the bake process, the second cover 230 is raised a predetermined height in the chamber 250. Here, the wafer W is also raised the same predetermined height by the elevation pins 281. Thus, the distance between the second cover 230 and the wafer W is kept constant and the temperature is distributed uniformly in the wafer W. In this state, the wafer W is in the standby state in the sealed chamber 250, ready for the next process.

As described above, the bake system according to an exemplary embodiment of the present invention has a cover for preventing heat convection from occurring on the wafer disposed in the chamber. Thus, the temperature distribution in the wafer is constant in the bake process. Accordingly, a resist pattern having even line widths can be obtained.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A bake system comprising:
    a heating plate having a substrate on an upper surface thereof;
    a case disposed below the heating plate and supporting the heating plate;
    a first cover disposed above the heating plate and coupled to the case to form a chamber; and
    a second cover disposed in the first cover, and directly above the substrate in the bake process for preventing heat convection on the substrate,
    wherein a supporting member that supports the second cover is installed to be ascended and descended in the first cover,
    wherein an elevation hole that guides the elevation of the supporting member is formed on a side wall of the first cover, and one end portion of the supporting member protrudes out of the first cover through the elevation hole;
    wherein one end portion of the supporting member is connected to a driving source for elevating the supporting member; and
    wherein the first cover is elevated by the driving source.

2. The bake system of claim 1, wherein the second cover is installed to be ascended and descended, and is descended in the bake process to be positioned a predetermined distance above the substrate.

3. The bake system of claim 1, wherein a connecting member is disposed between the second cover and the supporting member.

4. The bake system of claim 1, wherein a sealing member for sealing the chamber is disposed between the first cover and the case.

5. The bake system of claim 1, wherein a plurality of elevation pins for elevating the substrate penetrate through the heating plate in the case.

6. A bake system comprising:
- a heating plate having a substrate on an upper surface thereof;
- a case disposed below the heating plate and supporting the heating plate;
- a first cover disposed above the heating plate and coupled to the case to form a chamber; and
- a second cover disposed in the first cover, and directly above the substrate in the bake process for preventing heat convection on the substrate,
- wherein a supporting member that supports the second cover is installed to be ascended and descended on the first cover,
- wherein one end portion of the supporting member is connected to a driving source for elevating the supporting member,
- wherein an elevation member that moves with the supporting member is disposed between the end portion of the supporting member and the driving source, and an elevation hole that guides the elevation of the elevation member is formed on the side wall of the first cover; and
- wherein the first cover is elevated by the driving source.

7. The bake system of claim 6, wherein a connecting member that penetrates through the upper wall of the first cover is disposed between the second cover and the supporting member.

8. The bake system of claim 6, wherein a sealing member for sealing the chamber is disposed between the first cover and the case.

9. The bake system of claim 6, wherein a plurality of elevation pins for elevating the substrate penetrate through the heating plate in the case.

10. A bake system comprising:
- a heating plate having a substrate on an upper surface thereof;
- a case disposed below the heating plate and supporting the heating plate;
- a first cover disposed above the heating plate and coupled to the case to form a chamber; and
- a second cover disposed in the first cover, and directly above the substrate in the bake process for preventing heat convection on the substrate,
- wherein the distance between the second cover and the substrate is adjusted-adjustable based on the temperature of the heating plate, the temperature of the second cover and the temperature of air in the chamber.

11. A bake system comprising:
- a heating plate having a substrate on an upper surface thereof;
- a case disposed below the heating plate and supporting the heating plate;
- a first cover disposed above the heating plate and coupled to the case to form a chamber; and
- a second cover disposed in the first cover, and directly above the substrate in the bake process for preventing heat convection on the substrate,
- wherein a supporting member that supports the second cover is installed to be ascended and descended on the first cover,
- wherein one end portion of the supporting member is connected to a driving source for elevating the supporting member,
- wherein an elevation member that moves with the supporting member is disposed between the end portion of the supporting member and the driving source, and an elevation hole that guides the elevation of the elevation member is formed on the side wall of the first cover; and
- wherein the distance between the second cover and the substrate is adjustable based on the temperature of the heating plate, the temperature of the second cover and the temperature of air in the chamber.

* * * * *